US006993742B2

(12) United States Patent
Fryer et al.

(10) Patent No.: US 6,993,742 B2
(45) Date of Patent: Jan. 31, 2006

(54) THERMAL PROXIMITY EFFECTS IN LITHOGRAPHY

(75) Inventors: David S. Fryer, Hillsboro, OR (US); Vivek K. Singh, Portland, OR (US); Thanh N. Phung, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 10/638,066

(22) Filed: Aug. 8, 2003

(65) Prior Publication Data

US 2005/0030495 A1 Feb. 10, 2005

(51) Int. Cl.
*G06F 17/50* (2006.01)

(52) U.S. Cl. .............................. 716/19; 716/20; 716/21; 430/5; 430/312; 430/313; 430/330; 355/27; 355/29; 355/40

(58) Field of Classification Search ............ 716/19–21; 430/5, 30, 296, 327–330, 322, 323, 312–313, 430/394, 396; 355/27, 29, 40
See application file for complete search history.

(56) References Cited

U.S. PATENT DOCUMENTS

| 5,304,441 | A  | * | 4/1994  | Samuels et al. ............... 430/30  |
| 6,040,118 | A  | * | 3/2000  | Capodieci .................... 430/328 |
| 6,818,389 | B2 | * | 11/2004 | Fritze et al. ................. 430/394 |
| 2002/0025375 | A1 | * | 2/2002 | Takamori et al. ........... 427/240 |
| 2002/0076658 | A1 | * | 6/2002 | Matsushita et al. ......... 430/322 |
| 2003/0008246 | A1 | * | 1/2003 | Cheng et al. ................ 430/323 |

* cited by examiner

*Primary Examiner*—Matthew Smith
(74) *Attorney, Agent, or Firm*—Robert A. Diehl

(57) ABSTRACT

A proximity correction tool receives an indication of a feature in a lithographic design. The proximity correction tool predicts a film edge placement for the feature in a resist film based at least in part on thermal proximity effects in the resist film.

18 Claims, 10 Drawing Sheets

THERMAL PROXIMITY EFFECTS IN LITHOGRAPHY

FIELD OF THE INVENTION

The present invention relates to the field of lithography. More specifically, the present invention relates to thermal proximity effects in lithography.

BACKGROUND

Lithography involves transferring a design or pattern onto a surface. In a typical lithographic process, a light source projects a design from a mask onto a surface. The surface is covered with a light-sensitive material called a resist film. Rather like photographic film, the resist film is exposed with the image from the mask. A thermo-chemical process, called post exposure bake, fixes the image in the resist film and various other processes transfer the image from the resist film to the surface.

Integrated circuits (IC) are often manufactured using lithography. The lithographic process can be repeated multiple times on an IC chip to build circuits in multiple layers. Market pressures continually drive toward smaller, more densely packed features in IC designs, leading to a number of design innovations such as optical proximity correction (OPC).

OPC refers to a variety of techniques that have been developed to compensate for optical proximity effects in lithography. That is, the critical dimension (CD) of a design is usually the smallest feature size in the design. For a CD near or below the wavelength of the light source, optical effects can have an impact on how the feature is projected onto the resist film. For instance, light diffracts at the edges of apertures in a mask. Small apertures create diffraction patterns that fan out from each aperture. The diffraction patterns from neighboring apertures can interact, potentially influencing the edge placement of projected features. In other words, a projected feature may appear larger or smaller depending on the relative proximity of other feature edges in a mask. This is often called an optical proximity effect, and the relative change in edge placement due to optical proximity effects is often called edge placement error.

OPC usually involves adjusting the edges of features in a mask layout to pre-compensate for edge placement error. That is, various models can be used to predict an edge placement for a given edge due to the proximity of other edges. Based on the prediction, the edge can be adjusted in the mask layout. For example, if the feature is predicted to appear too large, the feature's edge may be moved in slightly in the mask layout to reduce the size of the projection.

BRIEF DESCRIPTION OF DRAWINGS

Examples of the present invention are illustrated in the accompanying drawings. The accompanying drawings, however, do not limit the scope of the present invention. Similar references in the drawings indicate similar elements.

DETAILED DESCRIPTION OF THE INVENTION

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternative embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful for understanding the present invention. However, the order of description should not be construed as to imply that these operations are necessarily performed in the order they are presented, nor even order dependent. Lastly, repeated usage of the phrase "in one embodiment" does not necessarily refer to the same embodiment, although it may.

Embodiments of the present invention involve edge placement error introduced by thermal proximity effects in a lithographic resist film. That is, embodiments of the present invention recognize that the proximity of features can influence the temperature distribution in a resist film, and temperature distribution in a resist film can influence edge placement. Based on this knowledge, embodiments of the present invention can perform a number of useful functions, such as introducing proximity corrections in mask layouts that are intended to compensate for both optical and thermal proximity effects.

Figure 1:
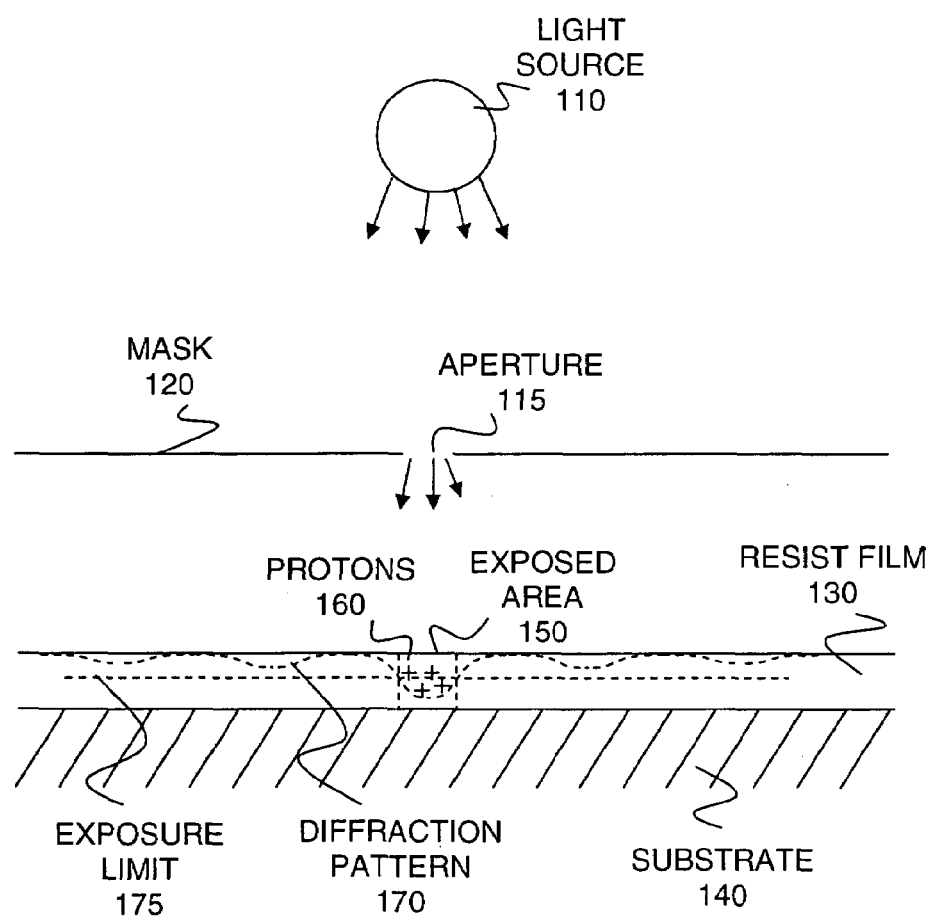
FIG. 1 illustrates one embodiment of a lithographic system.

FIG. 1 illustrates one embodiment of a typical lithographic system. Light from light source 110 shines on mask 120 and diffracts through aperture 115. The diffraction pattern 170 is incident on resist film 130, which covers substrate 140. Resist film 175 is adequately exposed where the intensity of diffraction pattern 170 is large enough to reach exposure limit 175, creating exposed area 150. The density of protons 160 is higher in exposed area 150 compared to the unexposed areas.

As discussed above, additional apertures could generate similar diffraction patterns. Neighboring diffraction patterns could partially overlap, potentially changing the shape of the intensity profile in the resist film and potentially moving the edges of exposed areas in or out. This edge placement error is introduced by optical effects during exposure.

Following exposure, a post exposure bake is often performed to fix the image in the resist film. For example, the substrate may be placed on a hot plate. The heat can induce a chemical reaction in the exposed areas of the resist film. As the exposed areas absorb the heat, some of the protons in the exposed areas migrate toward the unexposed areas, slightly moving the edges of the exposed areas into the unexposed areas. Assuming the temperature distribution is uniform across the entire film, the amount of migration tends to be relatively uniform.

Embodiments of the present invention, however, recognize that the temperature distribution may not be uniform due to the proximity of features. That is, the chemical reaction in each exposed area absorbs heat during post exposure bake, making each exposed area slightly cooler than the surrounding area. If exposed areas are densely packed, the cooler temperatures can accumulate, making densely packed areas cooler than more isolated areas. With the cooler temperatures, less proton migration tends to occurs. In other words, densely packed edges tend to move less than more isolated edges during post exposure bake.

Various equations can be used to model a variety of thermal proximity effects, such as the following combined heat and mass transfer equations:

Energy Balance:

$$\rho C_p \frac{\partial T}{\partial t} = \nabla(k\nabla T) + \Delta H \frac{\partial M}{\partial t}. \qquad \text{Equation 1}$$

Mass Balance:

$$\frac{\partial M}{\partial t} = \left(Ae^{\frac{-E_A}{RT}}\right)[M][H^+]. \qquad \text{Equation 2}$$

$$\frac{\partial H^+}{\partial t} = \nabla(D_{MH^+}\nabla[H^+]). \qquad \text{Equation 3}$$

Term definitions:
ρ=density
$C_p$=heat capacity
T=temperature
t=time
k=thermal conductivity
H=enthalpy of reaction
M=concentration of protecting group moiety
A=Arrhenius pre-exponential
$E_A$=Arrhenius activation energy
R=gas constant
$H^+$=concentration of acid moiety
$D_{MH+}$=diffusion coefficient of $H^+$ in M In many proximity models, only mass balance equations are considered, such as equations 2 and 3 above, and the temperature (T) in the mass balance equations is assumed to be constant throughout the system. That is, the temperature distribution is assumed to be uniform. Embodiments of the present invention, however, involve a more rigorous calculation of the temperature distribution in the resist film using, for instance, equation 1 to provide a non-uniform temperature distribution. A non-uniform temperature distribution can contribute significantly to proximity bias, or edge placement error, in a lithographic system.

Figure 2:
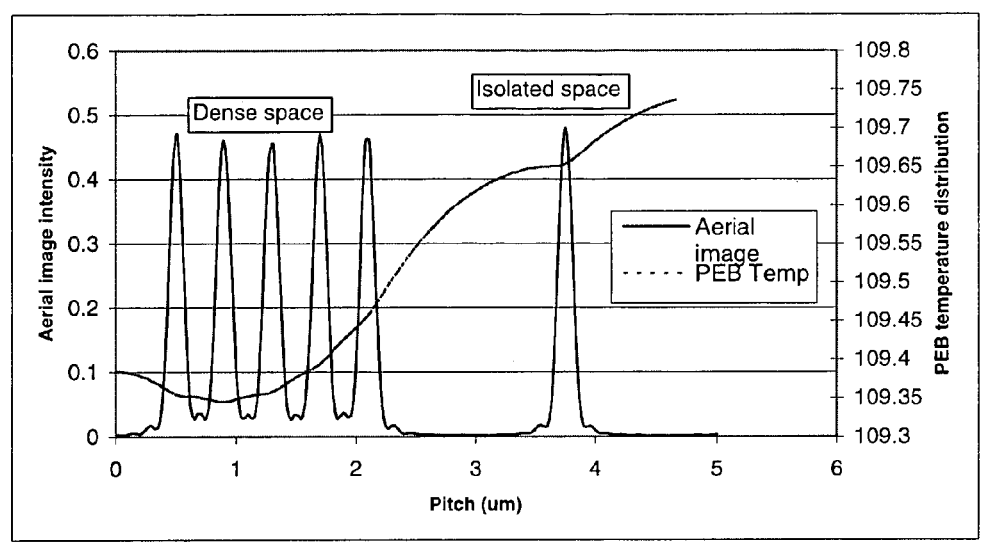
FIG. 2 illustrates one embodiment of aerial image intensity and temperature distribution verses pitch.

For example, FIG. 2 illustrates one embodiment of a post-exposure-bake temperature distribution (PEB temp) and an aerial image intensity profile, both as a function of pitch. Pitch is a measure of feature density. A small pitch corresponds to a more densely packed space and a large pitch corresponds to a more isolate space.

The aerial intensity profile basically corresponds to the intensity of light exposure for various pitches. A solution to the mass balance equations using a uniform temperature distribution would likely be roughly equivalent to the aerial image intensity profile because proton migration is assumed to be uniform. The temperature distribution, however, is clearly not uniform in the illustrated embodiment, and is a strong function of the proximity of features on the mask. In other words, the temperature is lower in denser areas and higher in isolated areas.

A thermal proximity model can also include a variety of heat transfer balance equations for the substrate, such as:

$$\rho C_p \frac{\partial T}{\partial t} = \nabla(k\nabla T). \qquad \text{Equation 4}$$

Equation 4 has the same format as Equation 1, except without a source term. This equation can model the rate of heat transfer through a substrate from a hotplate to the interface between the resist film and the substrate. This rate can be important since the enthalpy of reaction is usually negative for most resist film systems, and the reacting exposed areas in the resist film represent heat sinks. A heat sink can be more or less significant depending on the thermal mass and temperature of a hot plate.

Figure 3:
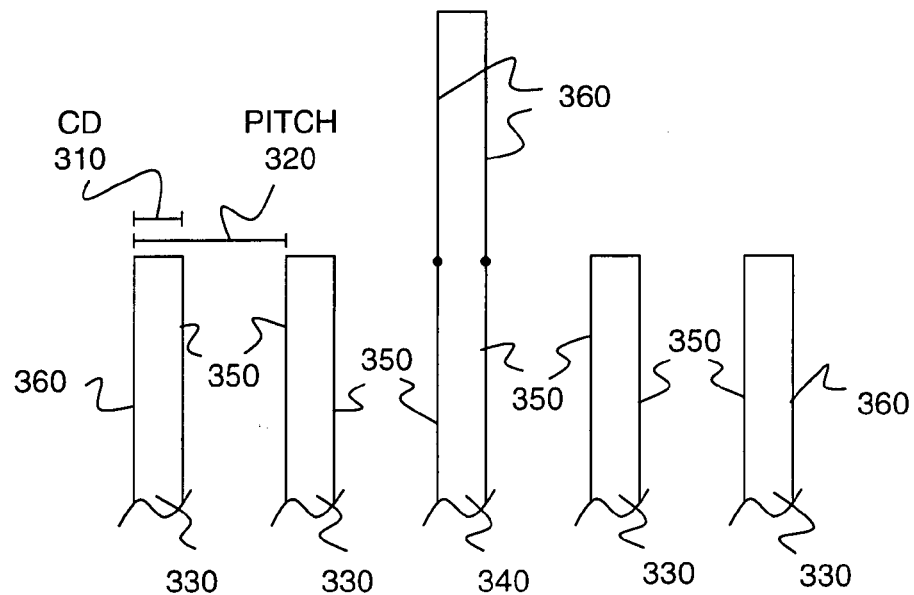
FIG. 3 illustrates one embodiment of a design section.

FIG. 3 illustrates an example of part of a design layout. The example includes four short line ends 330 and one long line end 340. Each line's width is the critical dimension 310. Edges 350 are densely packed, having a pitch 320. Edges 360 are isolated.

Figure 4:
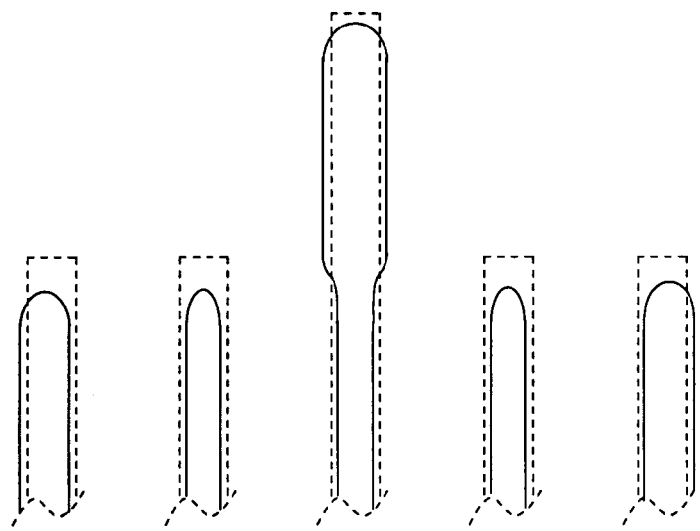
FIG. 4 illustrates one embodiment of the design section as printed.
Figure 5:
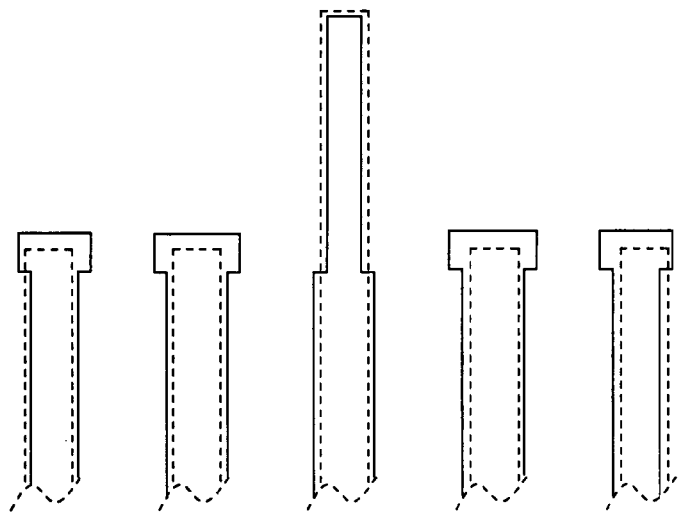
FIG. 5 illustrates one embodiment of the design section after proximity correction.

FIG. 4 illustrates one embodiment of how the line ends might print compared to the intended feature shapes. Due to proximity effects, the more densely packed edges 350 from FIG. 3 have printed too far in and the isolated edges 360 from FIG. 3 have printed too far out. For instance, due to optical effects, all of the line ends may have printed smaller than desired. Then, due to higher temperatures during post exposure bake at the isolated edges compared to the densely packed edges, the isolated edges may have migrated further out. FIG. 5 illustrates one embodiment of how the layout may be pre-compensated compared to the intended feature shapes to adjust for the proximity effects.

Figure 6:
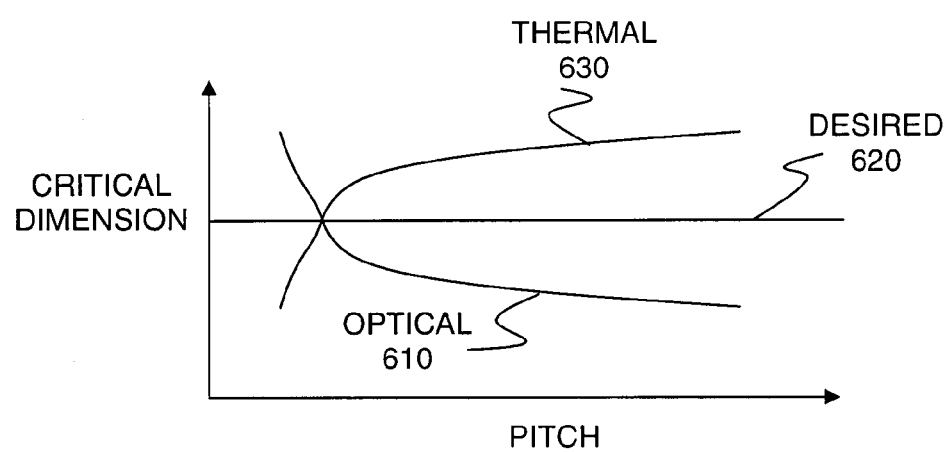
FIG. 6 illustrates one embodiment of critical dimension curves due to thermal and optical proximity effects.

FIG. 6 illustrates one embodiment of critical dimension functions versus pitch. In the illustrated embodiment, as the pitch increases toward more isolated densities, the curve 610 for optical proximity effects provides smaller than the desired critical dimension 620. That is, features intended to have the desired critical dimension 620 will appear too small in isolated areas. Conversely, the curve 630 for thermal proximity effects provides larger than the desired critical dimension 620 in isolated areas. In which case, pre-compensating based only on optical effects may be inadequate in many designs.

Figure 7:
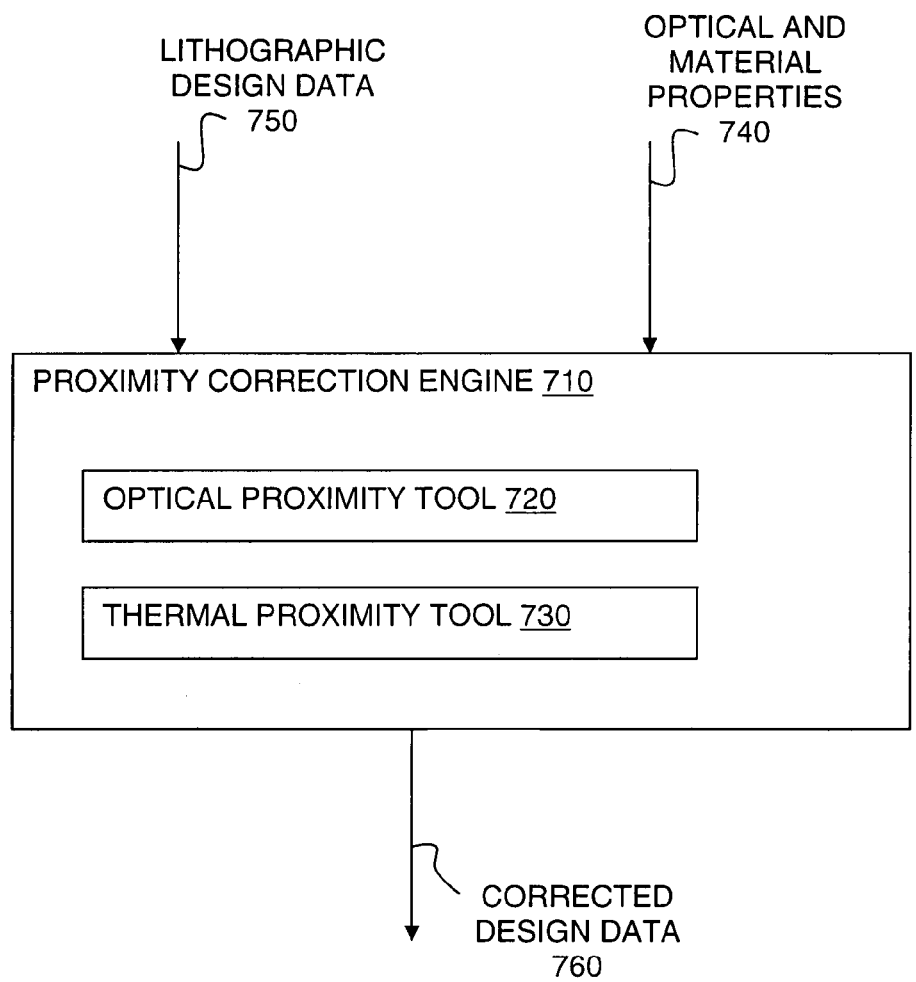
FIG. 7 illustrates one embodiment of a proximity correction engine.

FIG. 7 illustrates one embodiment of a proximity correction engine 710 that includes both an optical proximity correction tool 720 and a thermal proximity correction tool

730. Correction engine 710 receives optical and material properties 740 for a given lithographic system. The optical properties could include, for instance, wavelength of the light source, lens characteristics, and the like. The material properties could include, for instance, enthalpy of reaction, thermal conductivity, density, and heat capacity. Correction engine 750 also receives lithographic design data 750. Based on the properties 740 and the design data 750, engine 710 outputs corrected design data 760.

Figure 8:
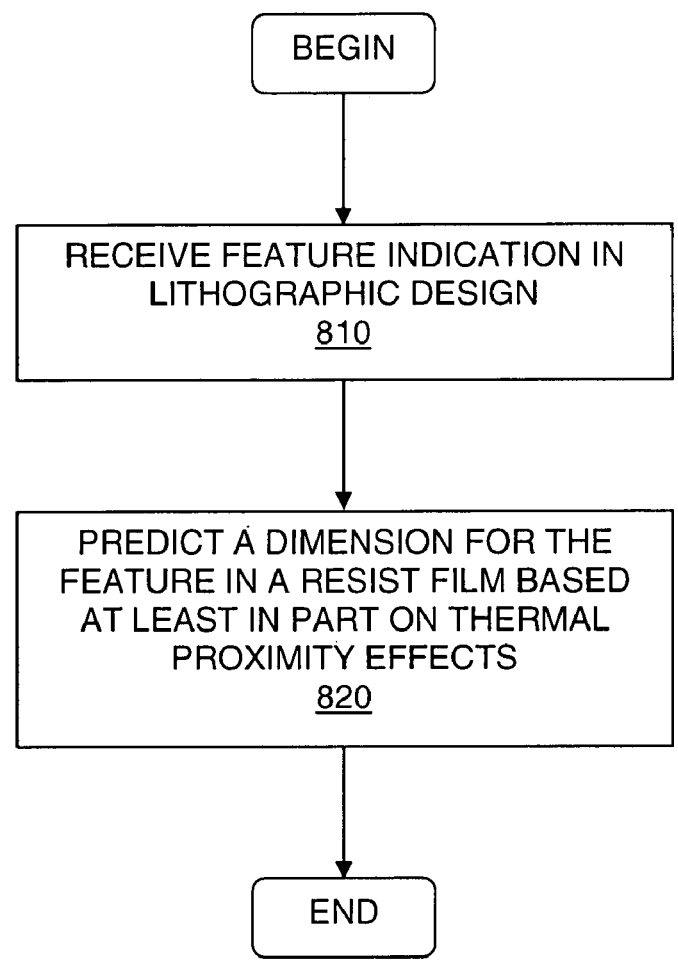
FIG. 8 illustrates one embodiment of a high level operational flow.
Figure 9A:
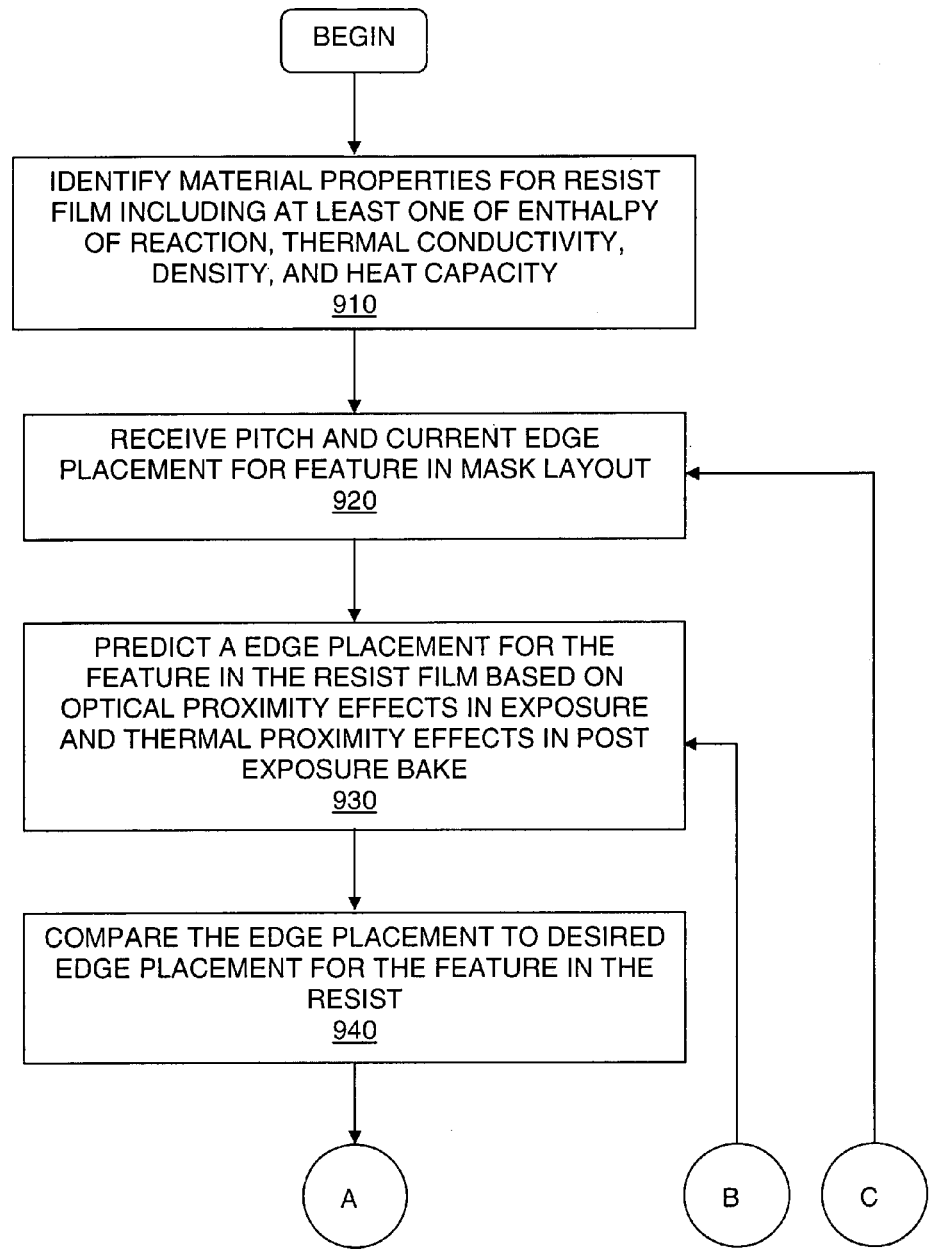
FIGS. 9A and 9B illustrate one embodiment of an operation flow in more detail.
Figure 9B:
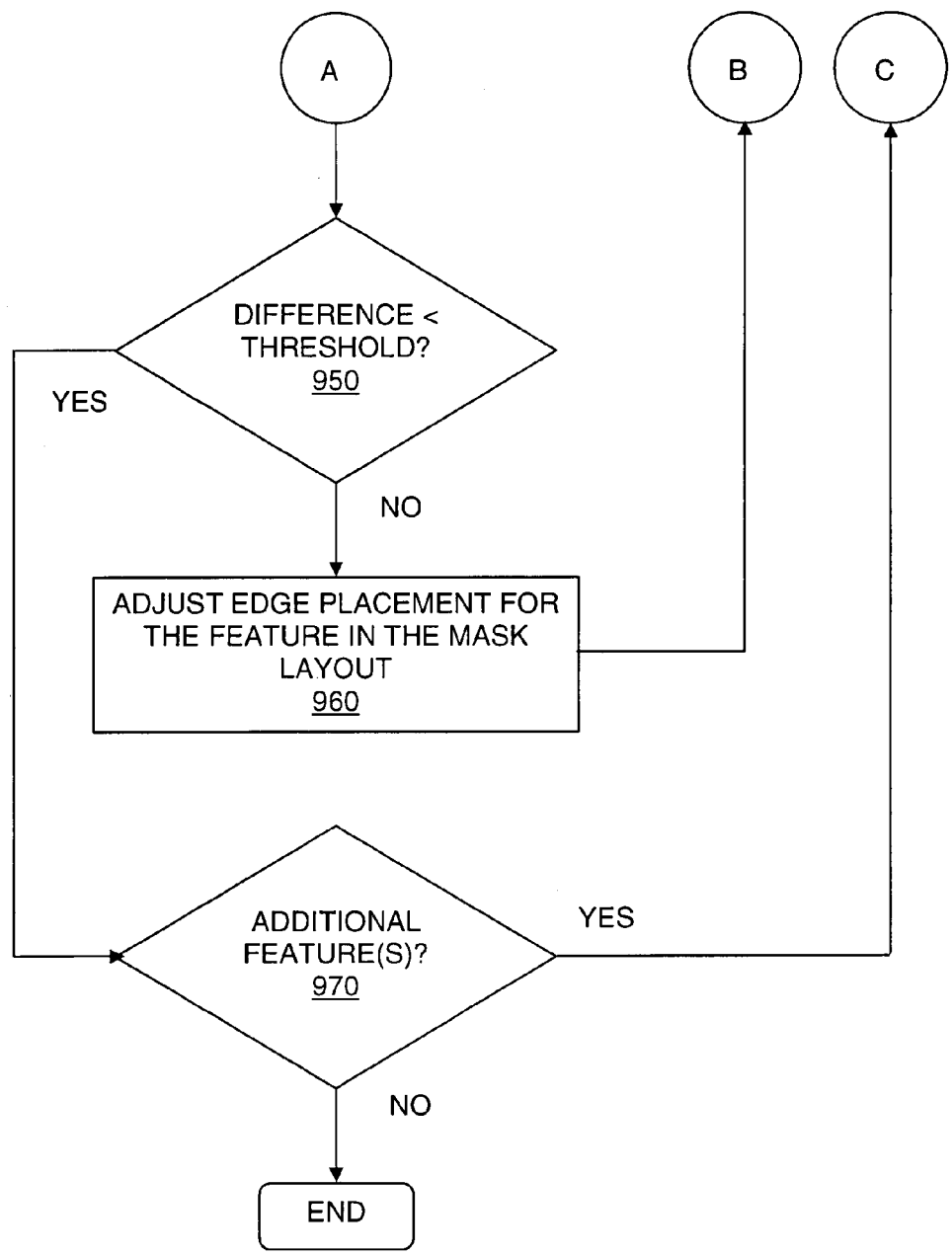
Figure 10:
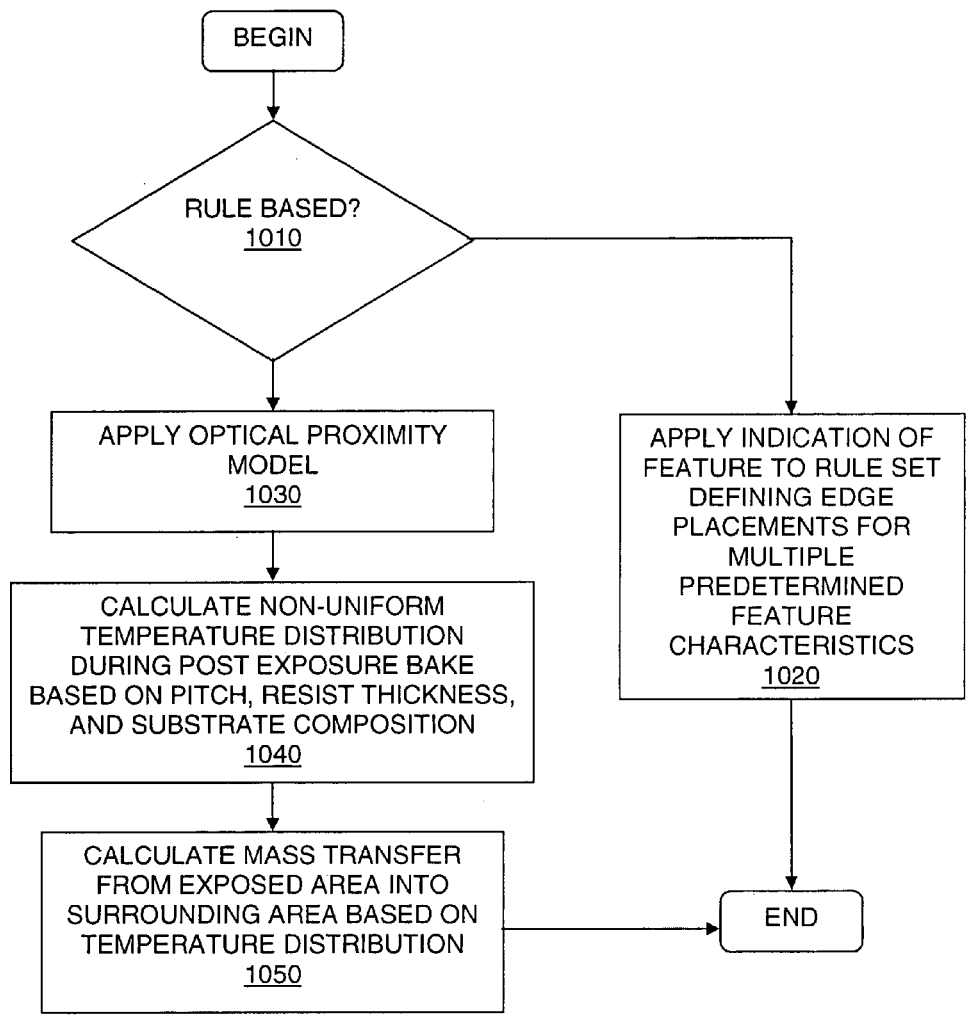
FIG. 10 illustrates one embodiment of an operation flow for edge placement prediction.

FIGS. 8–10 demonstrate operations that may be performed by, for instance, proximity correction engine 710 from FIG. 7. FIG. 8 illustrates a high level process. At 810, the process receives an indication of a feature in a lithographic design. The indication could take any of a number of formats, including GDSII data commonly used to represent a design layout. From the GDSII data, any number of approaches can be used to identify particular feature edges as well as determine the pitch, or density of neighboring features. Then, at 820, the process predicts a placement for the feature in a resist film based at least in part on thermal proximity effects. For example, the equations discussed above could be used to make this prediction.

FIGS. 9A and 9B illustrate a more detailed process. At 910, the process identifies material properties for the resist film including enthalpy of reaction, thermal conductivity, density, and heat capacity. Any number of approaches can be used to ascertain and/or measure the various material properties.

At 920, the process receives a pitch and a current edge placement for a feature edge in a mask layout. At 930, the process predicts an edge placement for the feature in the resist film based on both optical proximity effects during exposure and thermal proximity effects during post exposure bake. At 940, the process compares the predicted edge placement with the desired edge placement for the feature in the resist film. At 950, if the predicted edge placement is acceptable, or the difference between the predicted and desired placements is within some acceptable threshold, the process proceeds to 970 to check for additional edges to correct in the design. If, however, the predicted edge placement is not acceptable at 950, the process proceeds to adjust the edge placement for the feature in the mask layout by some incremental amount to try to compensate for the edge placement error at 960. After adjusting the layout, the illustrated process returns to 930 to repeat the prediction using the newly adjusted edge placement. The process may go through multiple iterations before a suitable solution is found and the process proceeds to 970. At 970, if additional feature edges remain to be corrected in the design, the process returns to 920 to correct the next edge. When no more edges remain to be corrected, the process ends.

FIG. 10 illustrates one embodiment of a process for predicting an edge placement in more detail. The process provides two alternate methods, rule-based and model-based. At 1010, the process determines which method to use. This selection could be user defined or it could be based on any of a number of factors, such as the complexity of the layout, whether or not a previous attempt to correct a layout was successful, and the like.

If rule-based prediction is enabled at 1010, the process applies the indication of the feature to a rule set at 1020. The rule set defines a number of predetermined edge placement predictions for various classes of feature characteristics. For example, a particular range of pitches may correspond to a particular edge placement error in the rule set. The prediction is simply a matter of looking up the appropriate edge placement error for the edge and biasing the edge accordingly.

If model-based prediction is enabled at 1010, the process starts by applying an optical proximity model at 1030. Any number of optical models can be used to predict the edge placement error introduced during exposure. Then, to predict the edge placement error introduced during post exposure bake, the process calculates a non-uniform temperature distribution for the resist film based on pitch, resist thickness, substrate composition, and the like, at 1040. Using the temperature distribution, the process then calculates mass transfer from the exposed area into the surrounding area at 1050 to predict the total edge placement error. Rule-based methods tend to be comparatively quick, but model-based methods tend to be more accurate.

FIGS. 7–10 illustrate a number of implementation specific details. Other embodiments may not include all of the illustrated elements, may include additional elements, may arrange element in a different order, may combine one or more elements, and the like. For instance, in FIG. 9, rather than iteratively predicting and adjusting edge placement by an incremental amount, the adjustment amount could be directly calculated.

Figure 11:
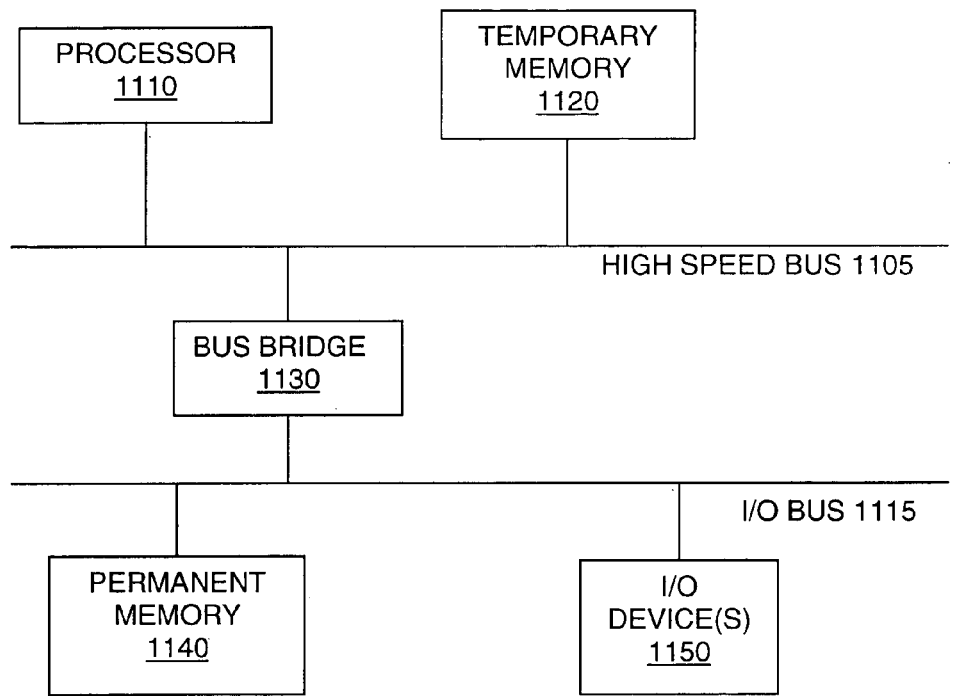
FIG. 11 illustrates one embodiment of a generic hardware system.

FIG. 11 illustrates one embodiment of a generic hardware system intended to represent a broad category of computer systems such as personal computers, workstations, and/or embedded systems. In the illustrated embodiment, the hardware system includes processor 1110 coupled to high speed bus 1105, which is coupled to input/output (I/O) bus 1115 through bus bridge 1130. Temporary memory 1120 is coupled to bus 1105. Permanent memory 1140 is coupled to bus 1115. I/O device(s) 1150 is also coupled to bus 1115. I/O device(s) 1150 may include a display device, a keyboard, one or more external network interfaces, etc.

Certain embodiments may include additional components, may not require all of the above components, or may combine one or more components. For instance, temporary memory 1120 may be on-chip with processor 1110. Alternately, permanent memory 1140 may be eliminated and temporary memory 1120 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Similarly, a variety of alternate internal networks could be used including, for instance, an internal network based on a high speed system bus with a memory controller hub and an I/O controller hub. Additional components may include additional processors, a CD ROM drive, additional memories, and other peripheral components known in the art.

In one embodiment, the present invention, as described above, could be implemented using one or more hardware systems such as the hardware system of FIG. 11. Where more than one computer is used, the systems can be coupled to communicate over an external network, such as a local area network (LAN), an internet protocol (IP) network, etc. In one embodiment, one or more functions of the present invention as described above may be implemented as software routines executed by one or more execution units within the computer(s). For a given computer, the software routines can be stored on a storage device, such as permanent memory 1140.

Figure 12:
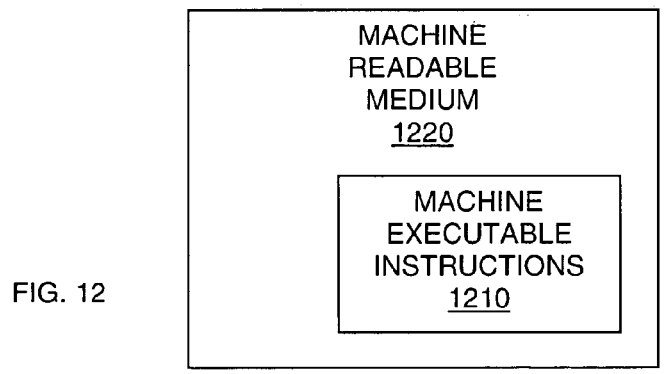
FIG. 12 illustrates one embodiment of a machine-readable medium to store executable instructions for embodiments of the present invention.

Alternately, as shown in FIG. 12, the software routines can be machine executable instructions 1210 stored using any machine readable storage medium 1220, such as a hard drive, a diskette, CD-ROM, magnetic tape, digital video or versatile disk (DVD), laser disk, ROM, Flash memory, etc. The series of instructions need not be stored locally, and could be received from a remote storage device, such as a server on a network, a CD-ROM device, a floppy disk, etc., through, for instance, I/O device(s) 1150 of FIG. 11.

From whatever source, the instructions may be copied from the storage device into temporary memory 1120 and then accessed and executed by processor 1110. In one implementation, these software routines are written in the C programming language. It is to be appreciated, however, that these routines may be implemented in any of a wide variety of programming languages.

In alternate embodiments, the embodiments of the present invention described above may be implemented in discrete hardware or firmware. For example, one or more application specific integrated circuits (ASICs) could be programmed with one or more of the above described functions. In another example, one or more functions of the present invention could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination of hardware and software could be used to implement one or more functions of the present invention.

Thus, thermal proximity effects in lithography is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:
   receiving an indication of a feature in a lithographic design;
   predicting a film edge placement for the feature in a resist film based at least in part on thermal proximity effects in the resist film;
   comparing the film edge placement to a desired edge placement for the feature in the resist film; and
   adjusting a layout edge placement for the feature in a mask layout if the film edge placement is different from the desired edge placement by at least a particular amount.

2. The method of claim 1 wherein predicting the film edge placement for the feature in the resist film is further based on optical proximity effects during exposure of the resist film.

3. The method of claim 1 further comprising:
   repeating the predicting, comparing, and adjusting until the film edge placement is different from the desired edge placement by less than the particular amount.

4. The method of claim 1 wherein the indication of the feature comprises at least one of an indication of a pattern density for the feature and a current layout edge placement for the feature in a mask layout.

5. The method of claim 4 wherein the indication of the pattern density comprises a pitch.

6. The method of claim 1 wherein the thermal proximity effects in the resist film are due to a post exposure bake.

7. A method comprising:
   receiving an indication of a feature in a lithographic design;
   predicting a film edge placement for the feature in a resist film based at least in part on thermal proximity effects in the resist film, wherein predicting the film edge placement comprises:
      applying the indication to a rule set, said rule set defining a plurality of potential film edge placements for a plurality of predetermined feature characteristics.

8. A method comprising:
   receiving an indication of a feature in a lithographic design;
   predicting a film edge placement for the feature in a resist film based at least in part on thermal proximity effects in the resist film, wherein predicting the film edge placement comprises:
      calculating a temperature distribution during a post exposure bake for at least an exposed area and a surrounding area corresponding to the feature in the resist film based at least in part on the indication of the feature; and
      calculating a mass transfer from the exposed area into the surrounding area based at least in part on the temperature distribution.

9. The method of claim 8 wherein the temperature distribution comprises a non-uniform distribution corresponding to at least one of an exposure pattern density, a resist thickness, and a substrate composition.

10. The method of claim 8 wherein calculating the temperature distribution and calculating the mass transfer are both further based on a plurality of material properties for the resist film.

11. The method of claim 10 wherein the plurality of material properties comprise at least one of an enthalpy of reaction, a thermal conductivity, a density, and a heat capacity.

12. A machine readable medium having stored thereon machine executable instructions, the execution of which to implement a method comprising:
   receiving an indication of a feature in a lithographic design;
   predicting a film edge placement for the feature in a resist film based at least in part on thermal proximity effects in the resist film;
   comparing the film edge placement to a desired edge placement for the feature in the resist film; and
   adjusting a layout edge placement for the feature in a mask layout if the film edge placement is different from the desired edge placement by at least a particular amount.

13. The machine readable medium of claim 12 wherein the method further comprises:
   repeating the predicting, comparing, and adjusting until the film edge placement is different from the desired edge placement by less than the particular amount.

14. A machine readable medium having stored thereon machine executable instructions, the execution of which to implement a method comprising:
   receiving an indication of a feature in a lithographic design;
   predicting a film edge placement for the feature in a resist film based at least in part on thermal proximity effects in the resist film; wherein predicting the film edge placement comprises:

calculating a temperature distribution during a post exposure bake for at least an exposed area and a surrounding area corresponding to the feature in the resist film based at least in part on the indication of the feature; and calculating a mass transfer from the exposed area into the surrounding area based at least in part on the temperature distribution.

15. A proximity correction system comprising:

a hard drive to store an indication of a feature in a lithographic design; and a proximity correction engine to predict a film edge placement for the feature in a resist film based at least in part on thermal proximity effects in the resist film, compare the film edge placement to a desired edge placement for the feature in the resist film, and adjust a layout edge placement for the feature in a mask layout if the film edge placement is different from the desired edge placement by at least a particular amount.

16. The system of claim 15 wherein the proximity correction engine is further to:

repeat the predicting, comparing, and adjusting until the film edge placement is different from the desired edge placement by less than the particular amount.

17. The system of claim 15 wherein the proximity correction engine comprises at least one of a processor, an application specific integrated circuit, and a programmable gate array.

18. A proximity correction system comprising:

a hard drive to store an indication of a feature in a lithographic design; and a proximity correction engine to predict a film edge placement for the feature in a resist film based at least in part on thermal proximity effects in the resist film, wherein to predict the film edge placement, the proximity correction engine is to:

calculate a temperature distribution during a post exposure bake for at least an exposed area and a surrounding area corresponding to the feature in the resist film based at least in part on the indication of the feature; and calculate a mass transfer from the exposed area into the surrounding area based at least in part on the temperature distribution.

* * * * *